(12) United States Patent
Nishizawa (10) Patent No.: US 8,164,196 B2
(45) Date of Patent: Apr. 24, 2012

(54) SEMICONDUCTOR DEVICE AND METHOD FOR MANUFACTURING THE SAME

(75) Inventor: Atsushi Nishizawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/941,254

(22) Filed: Nov. 8, 2010

(65) Prior Publication Data

US 2011/0049503 A1    Mar. 3, 2011

Related U.S. Application Data

(62) Division of application No. 12/355,046, filed on Jan. 16, 2009, now Pat. No. 7,855,138.

(30) Foreign Application Priority Data

Oct. 29, 2008   (JP) ................................ 2008-278351

(51) Int. Cl.
*H01L 23/48* (2006.01)
(52) U.S. Cl. ...................................... 257/774
(58) Field of Classification Search .................. 257/774, 257/E23.145, E21.627, E21.641
See application file for complete search history.

(56) References Cited

U.S. PATENT DOCUMENTS

| | | | |
|---|---|---|---|
| 6,686,662 B2 * | 2/2004 | Merchant et al. | 257/751 |
| 7,250,683 B2 * | 7/2007 | Tsai et al. | 257/774 |
| 7,972,954 B2 * | 7/2011 | Weber | 438/618 |
| 7,972,976 B1 * | 7/2011 | van den Hoek et al. | 438/781 |
| 2007/0108514 A1 | 5/2007 | Inoue et al. | |
| 2007/0246755 A1 | 10/2007 | Lee et al. | |
| 2008/0061282 A1 | 3/2008 | Sato et al. | |
| 2008/0258216 A1 | 10/2008 | Kikuchi | |
| 2008/0296677 A1 | 12/2008 | Takaishi | |
| 2009/0114949 A1 | 5/2009 | Hebert | |
| 2009/0197404 A1 | 8/2009 | Yang | |
| 2009/0200604 A1 | 8/2009 | Chidambarrao et al. | |
| 2009/0218699 A1 * | 9/2009 | Torres et al. | 257/774 |
| 2009/0242973 A1 * | 10/2009 | Hebert et al. | 257/330 |

FOREIGN PATENT DOCUMENTS

| | | |
|---|---|---|
| JP | 2004-072080 | 3/2004 |
| JP | 2007-005679 | 1/2007 |
| WO | 2004/107434 | 12/2004 |

* cited by examiner

*Primary Examiner* — Thao P. Le
(74) *Attorney, Agent, or Firm* — Young & Thompson (57) ABSTRACT

A semiconductor device includes a substrate, a low dielectric constant layer formed on the substrate, a first protection insulating layer formed on the low dielectric constant layer, and a trench with an interconnect embedded in formed in the first protection insulating layer and the low dielectric constant layer. The sidewall of the trench has a structure that the surface of the first protection insulating layer protrudes from the surface of the low dielectric constant layer, a second protection insulating layer formed by a chemical vapor deposition technique is embedded at the surface of the low dielectric constant layer in an area below the first protection insulating layer, and the sidewall of the trench is constituted by the second protection insulating layer and the first protection insulating layer.

5 Claims, 9 Drawing Sheets

SEMICONDUCTOR DEVICE AND METHOD FOR MANUFACTURING THE SAME

CROSS REFERENCE TO RELATED APPLICATIONS

This application is a new divisional of co-pending application Ser. No. 12/355,046 filed on Jan. 16, 2009, which claims priority to Japanese Application No. 2008-278351 filed on Oct. 29, 2008. The entire contents of each of the above-identified applications are hereby incorporated by reference.

BACKGROUND

1. Technical Field

The present invention relates to a semiconductor device and a method for manufacturing the same.

2. Related Art

Recently, a copper (Cu) interconnect having low resistance is usually being employed in an advanced semiconductor device pursuing down-scaling and high-speed operation. A copper interconnect is formed by a damascene process. In the damascene process, an interconnect is formed such that a concave portion is formed in an insulating interlayer, a barrier metal layer and a copper layer are formed in the concave portion to embed the concave portion, and portions of the copper layer and the barrier metal layer which are exposed outside the concave portion are removed by a chemical mechanical polishing (CMP) technique. A multi-layer interconnect structure is formed by repetitively performing this procedure.

Also, as a semiconductor device pursues a high performance, a low dielectric constant layer (so-called low-k layer) which is lower in relative dielectric constant (k value) than $SiO_2$ is used as an insulating interlayer of a multi-layer interconnect structure. There are various kinds of low dielectric constant layers, but low dielectric constant layers are commonly poor in adhesion or mechanical strength. Therefore, there is a problem in that when a trench is formed in a low dielectric constant layer, an altered (degraded) layer is formed on a sidewall of the trench (concave portion) during an etching process or a resist asking process, and thus an effective k value is increased, causing capacitance between interconnects to be increased.

Japanese Laid-open patent publication No. 2004-72080 discloses a method in which a concave portion is formed in a low dielectric constant layer using a photoresist layer, the photoresist layer is removed, the concave portion is embedded with a conductive layer, and then an altered (degraded) layer is removed. In this method, a dielectric constant layer is embedded on the whole surface of a void generated when the altered layer is removed and is then polished by a CMP process.

Japanese Laid-open patent publication No. 2007-5679 discloses a technology that a via hole is formed in a low dielectric constant layer using a resist layer (by photolithography process), the resist layer is removed, and a damage layer which is formed on a via hole sidewall through resist-removing process is finally removed. Thereafter, the whole surface of the via hole is embedded with a low dielectric constant organic material (such as polybenzoxazole and polyimide which does not have a Si—O bond and has high etching selectivity of equal to or more than 30 to the low dielectric constant layer), and a resist layer is formed thereon to form a trench. The resist layer and the low dielectric constant organic material in the via hole are removed when the trench is formed.

WO 2004/107434 discloses a structure that an insulating barrier layer containing an organic material is formed between an insulating interlayer and a metal interconnect.

SUMMARY

In Japanese Laid-open patent publication No. 2004-72080, however, the altered layer is removed after the concave portion is embedded with the conductive layer to form the copper interconnect. At this time, since the altered (degraded) layer formed along the copper interconnect is removed, the copper interconnect may be peeled. This may causes an open circuit of an interconnect or a short circuit between interconnects.

Also, in Japanese Laid-open patent publication No. 2007-5679, after the damage layer of the via hole is removed, the trench is formed in the low dielectric constant organic material embedded on the whole surface of the via hole. That is, an insulating interlayer in which the interconnect is to be formed is made of a low dielectric constant organic material with high etching selectivity to the lower low electric constant layer. Therefore, there is a problem in that the few alternative materials are available. Also, if the damage layer is formed on a sidewall of the trench during the trench formation, a problem that an effective k value is increased cannot be resolved.

In one embodiment, there is provided a method for manufacturing a semiconductor device, including: forming a trench in a low dielectric constant layer containing carbon formed on a substrate and a first protection insulating layer formed on the low dielectric constant layer. The forming the trench includes: forming a resist layer having an opening pattern for forming a trench on the first protection insulating layer, and forming a first concave portion in the first protection insulating layer and the low dielectric constant layer using the resist layer as a mask; removing a damage layer which is formed on a sidewall of the first concave portion of the low dielectric constant layer when the first concave portion is formed; forming a second protection insulating layer over the whole surface of the substrate by a chemical vapor deposition technique to form a second concave portion in the first protection insulating layer and the low dielectric constant layer by covering the sidewall of the first concave portion in the first protection insulating layer and the low dielectric constant layer with the second protection insulating layer; and shaping the second protection insulating layer by etch back so that the trench has a sidewall where the second protection insulating layer is selectively formed on a surface of the low dielectric constant layer.

In another embodiment, there is provided a semiconductor device, including: a substrate; a low dielectric constant layer formed on the substrate and containing carbon; a first protection insulating layer formed on the low dielectric constant layer; a trench formed in the first protection insulating layer and the low dielectric constant layer; and an interconnect embedded in the trench, wherein the sidewall of the trench has a structure that the surface of the first protection insulating layer protrudes from the surface of the low dielectric constant layer, a second protection insulating layer formed by a chemical vapor deposition technique is embedded at the surface of the low dielectric constant layer in an area below the first protection insulating layer, and the sidewall of the trench is constituted by the second protection insulating layer and the first protection insulating layer.

According to the structure, if the low dielectric constant layer is used as the insulating interlayer in which the trench is formed, even though the damage layer is formed in the low dielectric constant layer, the damage layer is removed, and the second protection insulating layer is formed on a sidewall of the low dielectric constant layer where the damage layer is removed. Therefore, an increment in capacitance between interconnects can be suppressed. Since the trench is formed by shaping the second protection insulating layer after forming the second protection insulating layer, the groove size of the trench can be easily controlled to form the trench.

Also, a suitable combination of the components, and conversion of the expression of the present invention in a method and a device are also effective as an aspect of the present invention.

According to the present invention, it is possible to suppress an increment in capacitance between interconnects by the damage layer formed when the trench is formed in a low dielectric constant layer as the insulating interlayer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, exemplary embodiments of the present invention will be described with reference to attached drawings. In drawings, like reference numerals denote like parts, and duplicated description will not be repeated.

First Exemplary Embodiment

FIGS. 1A to 4 are cross-sectional views illustrating a procedure of manufacturing a semi conductor device according to the exemplary embodiment of the present invention.

In the exemplary embodiment of the present invention, a procedure for forming a dual damascene trench (including both a wiring trench and a via trench) in a low dielectric constant layer by "via first method" will be described.

Figure 1A:
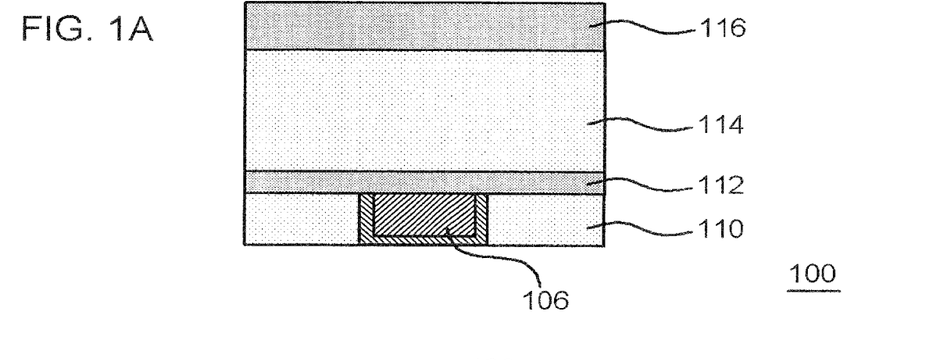
FIGS. 1A to 1C are cross-sectional views illustrating a procedure for manufacturing a semiconductor device according to an embodiment of the present invention.

A semiconductor device 100 has a structure that an insulating interlayer 110 is formed on a substrate (not shown) which is a semiconductor substrate such as a silicon substrate, and a lower copper interconnect 106 is formed in the insulating interlayer 110. In such a semiconductor device 100, an etching stopper 112, a low dielectric constant layer 114, and a first protection insulating layer 116 are formed on the insulating interlayer 110 and the lower copper interconnect 106 in the described order (FIG. 1A).

The low dielectric constant layer 114 may be made of a material containing carbon. For example, the low dielectric constant layer 114 may be made of a material which contains silicon (Si), oxygen (O) and carbon (C). For example, the low dielectric constant layer 114 may be formed of a SiOC layer, a SiOCH layer, or a porous layer thereof. In the exemplary embodiment of the present invention, the low dielectric constant layer 114 may be configured to have a k value of equal to or less than 3.0. The low dielectric constant layer 114 may be formed by a chemical vapor deposition (CVD) technique or a coating technique.

The insulating interlayer 110 may be formed of a low dielectric constant layer which is made of the same material as the low dielectric constant layer 114. For example, the etching stopper 112 may be formed of a SiCN layer. The first protection insulating layer 116 may be made of a material which functions as a moisture absorption protection layer which prevents moisture from being absorbed into the low dielectric constant layer 114. The first protection insulating layer 116 may be also made of a material which functions to protect the low dielectric constant layer 114 when a CMP process is performed after a conductive layer is embedded in a trench later. For example, the first protection insulating layer 116 may be formed of a $SiO_2$ layer. The first protection insulating layer 116 may be formed by a CVD technique.

Figure 1B:
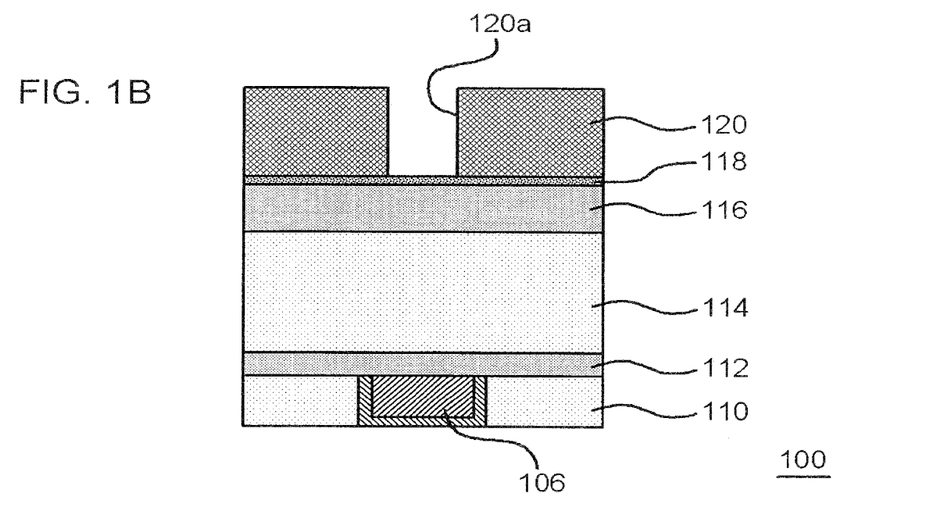

Subsequently, an antireflection layer 118 and a resist layer 120 having an opening pattern 120 for forming a via hole are formed on the first protection insulating layer 116 (FIG. 1B). The opening pattern 120a for forming a via hole is formed at a location which overlaps the lower copper interconnect 106 when it is seen from a top. The resist layer 120 may be formed using a photolithography technique.

Figure 1C:
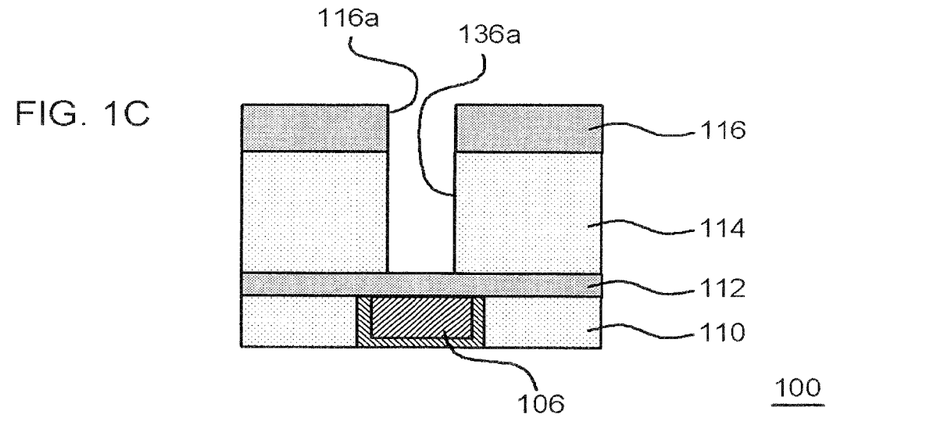

Then, the antireflection layer 118 and the first protection insulating layer 116 are etched using the resist layer 120 as a mask to form an opening pattern 116a in the first protection insulating layer 116. Subsequently, the low dielectric constant layer 114 is etched using the first protection insulating layer 116 as a mask to form a via hole 136a in the low dielectric constant layer 114. The via hole 136a may be formed by a dry-etching technique. As etching gas for etching the low dielectric constant layer 114, fluorocarbon gas such as $CF_4$ or $C_4F_8$ may be used, and gas such as $N_2$ gas, $O_2$ gas or Ar gas may be added. Thereafter, the resist layer 120 and the antireflection layer 118 are removed by ashing (FIG. 1C). Ashing for removing the resist layer 120 or the like may be performed using gas such as $O_2$ gas, $CO_2$ gas, $N_2/H_2$ gas, $NH_3$ gas, or $He/H_2$ gas.

Figure 2A:
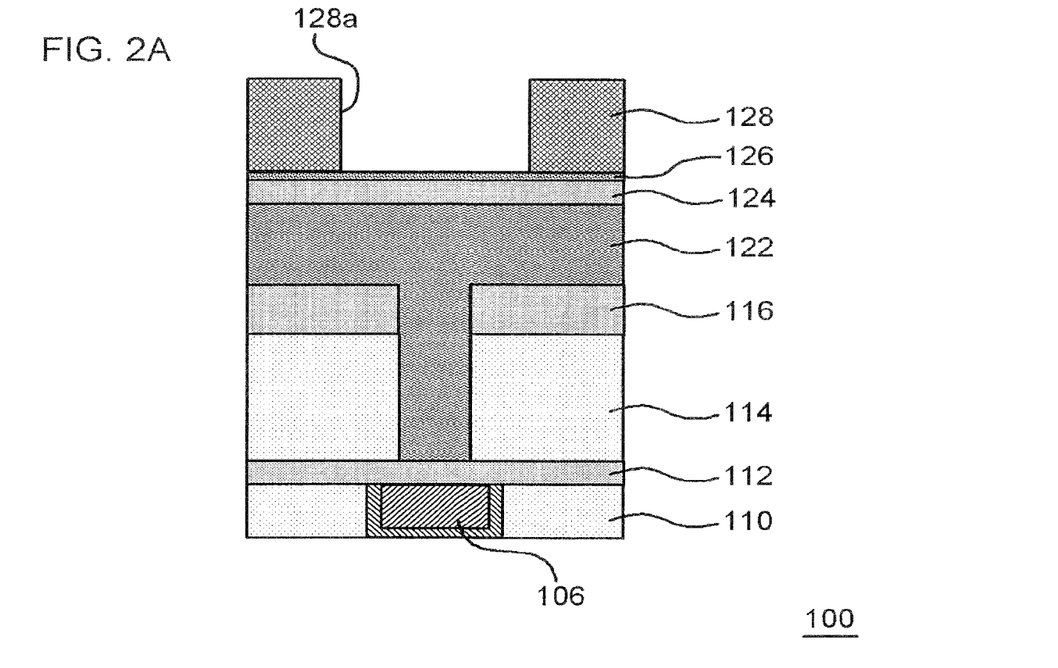
FIGS. 2A and 2B are cross-sectional views illustrating a procedure for manufacturing a semiconductor device according to the embodiment of the present invention.

After forming the via hole 136a, an organic layer 122 is formed over the whole surface of the substrate to fill the via hole 136a and the opening pattern 116a. An inorganic layer 124, an antireflection layer 126, and a resist layer 128 having an opening pattern 128a for forming a trench are formed on the organic layer 122 (FIG. 2A). Here, the opening pattern 128a for forming a trench is formed at a location which overlaps the via hole 136a when it is seen from a top. The resist layer 128 may be formed using a photolithography technique.

Figure 2B:
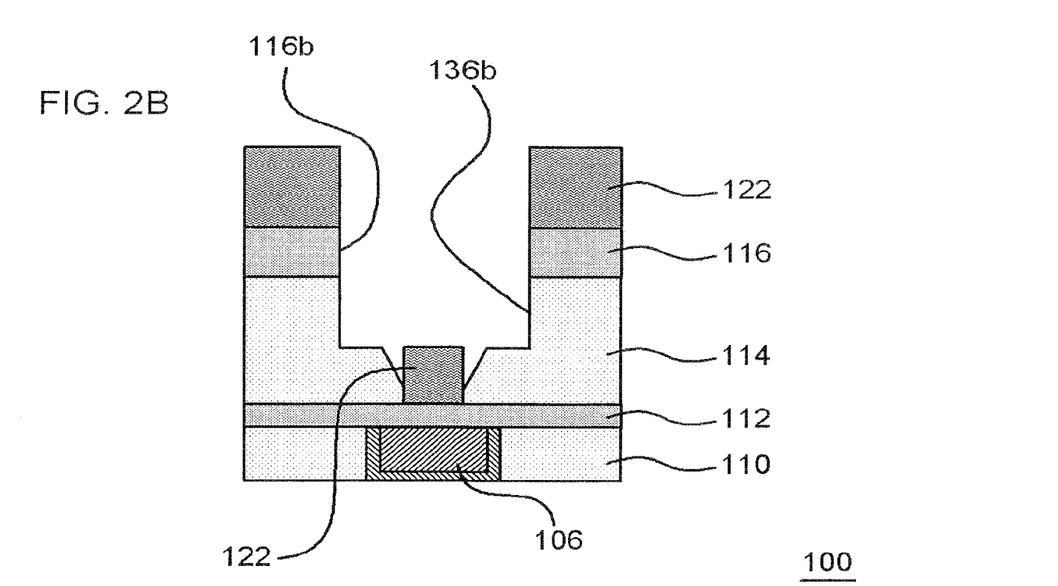

Subsequently, the antireflection layer 126, the inorganic layer 124, the organic layer 122, and the first protection insulating layer 116 are etched using the resist layer 128 as a mask to form an opening pattern 116b in the first protection insulating layer 116. The low dielectric constant layer 114 is etched using the first protection insulating layer 116 (and the above layers such as the organic layer 122) as a mask to form a first concave portion 136b in the first protection insulating layer 116 and the low dielectric constant layer 114 (FIG. 2B). As etching gas for etching the low dielectric constant layer 114, fluorocarbon gas such as $CF_4$ or $C_4F_8$ may be used, and gas such as $N_2$ gas, $O_2$ gas or Ar gas may be added.

Then, the organic layer 122 is removed by ashing. Here, the resist layer 128, the antireflection layer 126, and the inorganic layer 124 have been already removed in a process for etching other layers, but if such layers remain, they may be removed by the ashing as well. Ashing for removing, for example, the organic layer 122 or the like may be performed using gas such as $O_2$ gas, $CO_2$ gas, $N_2/H_2$ gas, $NH_3$ gas, or $He/H_2$ gas.

Figure 3A:
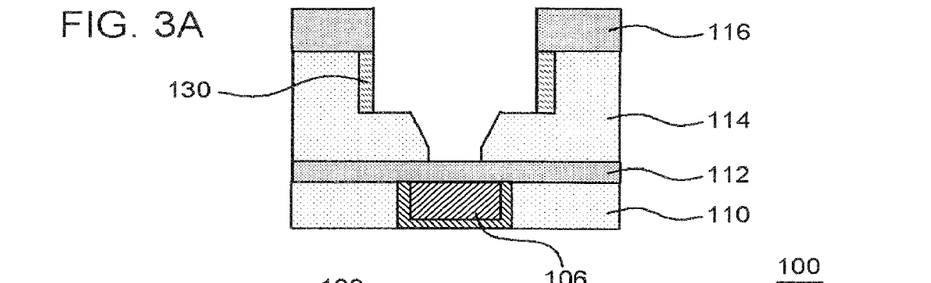
FIGS. 3A to 3D are cross-sectional views illustrating a procedure for manufacturing a semiconductor device according to the embodiment of the present invention.

When a low dielectric constant layer containing carbon is used as the low dielectric constant layer 114, carbon (C) or hydrogen (H) is extracted from the sidewall of the first concave portion 136b due to influence of the above gas when, for example, the resist layer 128 is removed. Therefore, the sidewall of the low dielectric constant layer 114 is altered to an altered layer (damage layer 130) having a high dielectric constant which is composed of silicon (Si) and oxygen (O) (FIG. 3A). If the damage layer 130 remains existed, capacitance between interconnects of the semiconductor device 100 is increased, and thus there is a problem in that high speed performance of the device gets damaged. Also, if the damage layer 130 remains existed, since moisture is absorbed into the damage layer 130, an effective k value of the damage layer 130 is more increased, and thus capacitance between interconnects is more increased.

Figure 3B:
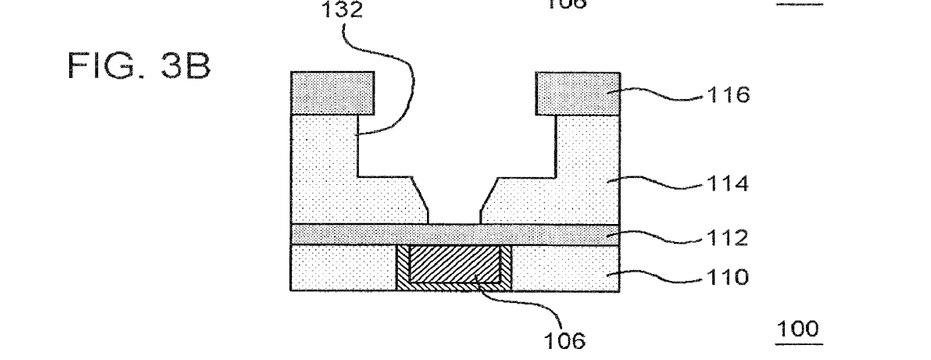

For this reason, in the exemplary embodiment of the present invention, the damage layer 130 is removed using, for example, hydrogen fluoride or the like (FIG. 3B). As a result, a recess portion 132 is formed in the low dielectric constant layer 114. That is, the sidewall of the first concave portion 136b has a structure that the surface of the first protection insulating layer 116 protrudes from the surface of the low dielectric constant layer 114.

Figure 3C:
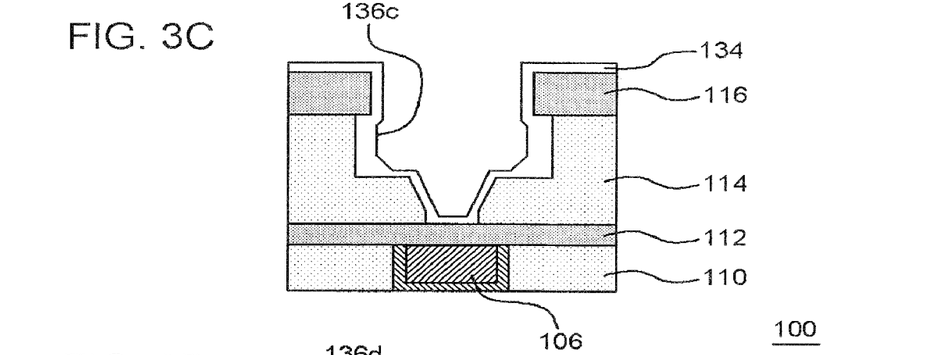

Subsequently, a second protection insulating layer 134 is formed over the whole surface of the substrate using a CVD technique such that the sidewall of the first concave portion 136b of the low dielectric constant layer 114 is covered with the second protection insulating layer 134 to form a second concave portion 136c in the first protection insulating layer 116 and the low dielectric constant layer 114 (FIG. 3C). As a result, the recess portion 132 formed by removing the damage layer 130 is embedded with the second protection insulating layer 134. In the exemplary embodiment of the present invention, the second protection insulating layer 134 may be configured to have a relative dielectric constant which is equal to or less than that of the low dielectric constant layer 114. For example, the second protection insulating layer 134 may be made of the same material as the low dielectric constant layer 114. Therefore, since influence of the damage layer 130 disappears, an increment in capacitance between interconnects can be suppressed.

Subsequently, the second protection insulating layer 134 is shaped by etch back to form a trench 136d that a sidewall is protected by the second protection insulating layer 134 in the low dielectric constant layer 114. At this time, since anisotropic etching is performed, a portion of the second protection insulating layer 134 formed at a top side of a stacking direction of the semiconductor device 100 is selectively removed. Also, since the first protection insulating layer 116 protrudes compared to the low dielectric constant layer 114, a portion of the second protection insulating layer 134 formed on the sidewall of the first protection insulating layer 116 is removed, but a portion of the second protection insulating layer 134 formed on the sidewall of the low dielectric constant layer 114 is protected by the first protection insulating layer 116 and remains without being etched out. Accordingly, the second protection insulating layer 134 can have a structure which is selectively formed only on the sidewall of the low dielectric constant layer 114.

Figure 3D:
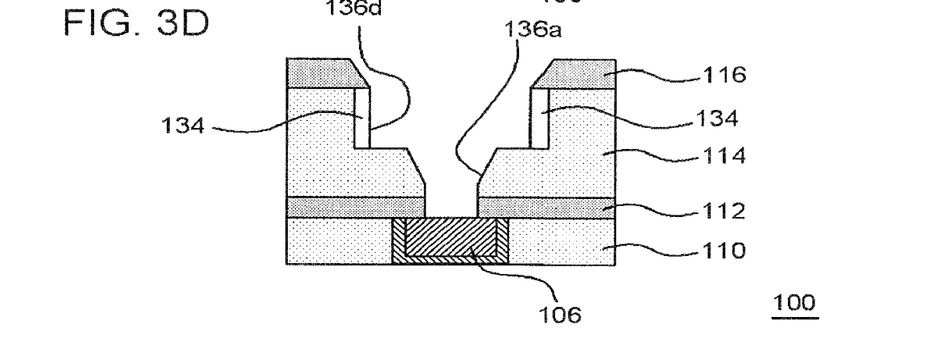

Subsequently, a portion of the etching stopper 112 corresponding to a bottom of the via hole 136a (and the second protection insulating layer 134 if the second protection insulating layer 134 remains on the bottom of the via hole 136a) is removed by anisotropic dry etching using, for example, $CF_4$ gas or a sputtering technique using, for example, an Ar ion, thereby exposing a portion of the lower copper interconnect 106 at the bottom of the via hole 136a (FIG. 3D). Accordingly, a dual damascene trench which includes the via hole 136a and the trench 136d is formed.

In the exemplary embodiment of the present invention, even in the trench 136d, an opening pattern of the first protection insulating layer 116 maintains the same shape as the opening pattern 128a for forming the trench of the resist layer 128. When the second protection insulating layer 134 is etched-back, the first protection insulating layer 116 functions as a mask, and a portion of the second protection insulating layer 134 below the first protection insulating layer 116 remains as it is. Therefore, the width of the trench 136d has the same width of the opening pattern of the first protection insulating layer 116, that is, it has the same width of the opening pattern 128a for forming the trench of the resist layer 128. Accordingly, a dimension of the groove size can be secured.

Figure 4:
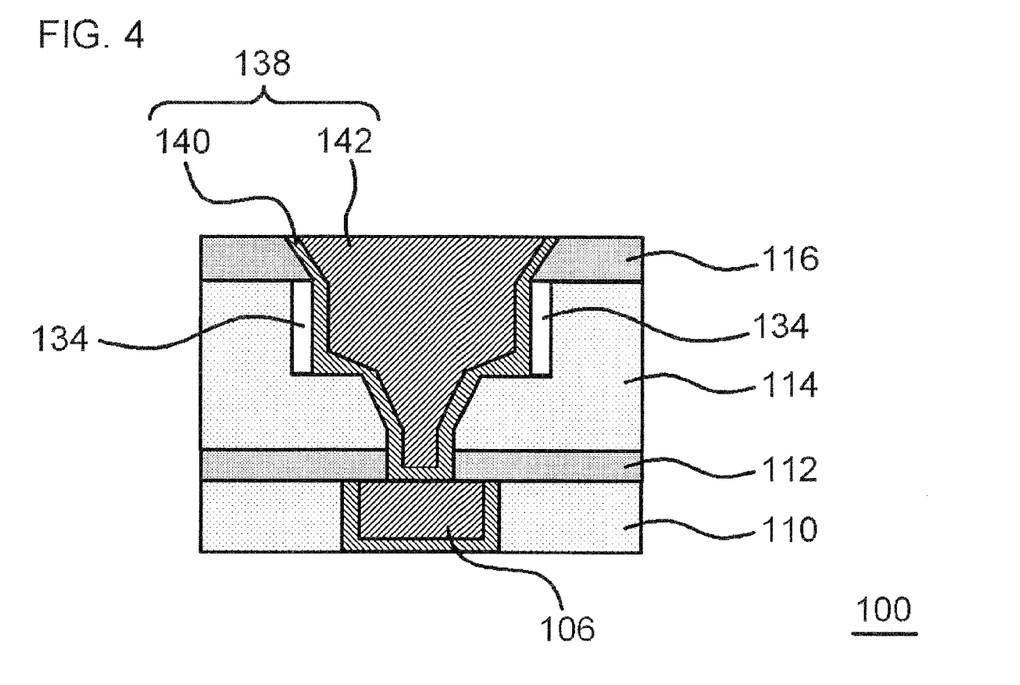
FIG. 4 is a cross-sectional view illustrating a procedure for manufacturing a semiconductor device according to the embodiment of the present invention.

Subsequently, a barrier metal layer 140 and a copper layer 142 are formed to embed the via hole 136a and the trench 136d, and portions of the barrier metal layer 140 and the copper layer 142 which are exposed outside the trench 136d are removed by a CMP technique, whereby a copper interconnect 138 is formed (FIG. 4). The copper interconnect 138 is electrically connected to the lower copper interconnect 106.

By the above procedures, manufactured is the semiconductor device 100 that the sidewall of the trench 136d has a structure that the surface of the first protection insulating layer 116 protrudes from the surface of the low dielectric constant layer 114, the second protection insulating layer 134 formed by a CVD technique is formed on the sidewall of the low dielectric constant layer 114 below the protruding portion of the first protection insulating layer 116, and the sidewall of the trench 136d is constituted by the second protection insulating layer 134 and the first protection insulating layer 116. Here, the sidewall of the trench 136d can have a structure that the surface of the second protection insulating layer 134 is matched with the surface of the first protection insulating layer 116.

FIGS. 5A to 5D are cross-sectional views illustrating another example of a procedure for manufacturing a semiconductor device 100 according to the exemplary embodiment of the present invention. Here, the procedure of FIGS. 5A to 5D is different from the above-described procedure in the fact that the etching stopper 112 is removed before forming the second protection insulating layer 134.

Figure 5A:
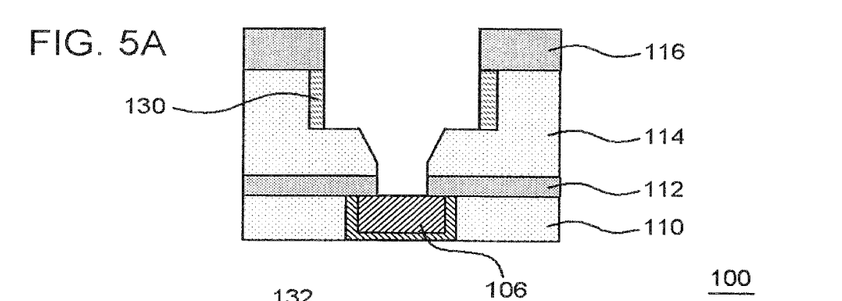
FIGS. 5A to 5D are cross-sectional views illustrating another example of a procedure for manufacturing a semiconductor device according to the embodiment of the present invention.

In this procedure, after forming the first concave portion 136b in the first protection insulating layer 116 and the low dielectric constant layer 114 which are described in FIG. 2B, the resist layer 128 and a portion of the etching stopper 112 formed at the bottom of the first concave portion 136b are removed together. For example, the etching stopper 112 may be removed by anisotropic dry etching using $CF_4$ gas or a sputtering technique using, for example, an Ar ion (FIG. 5A).

Figure 5B:
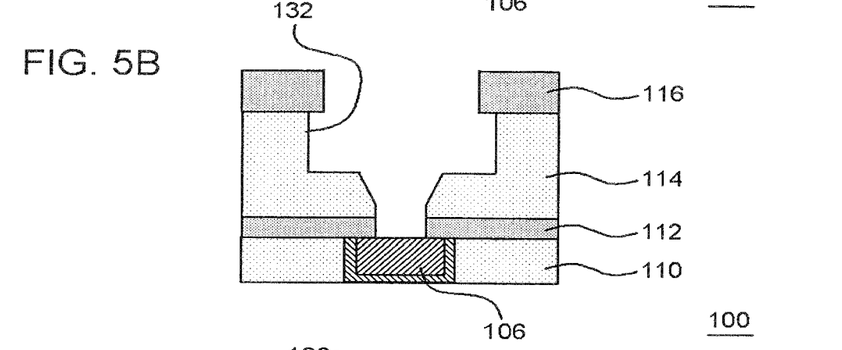
Figure 5C:
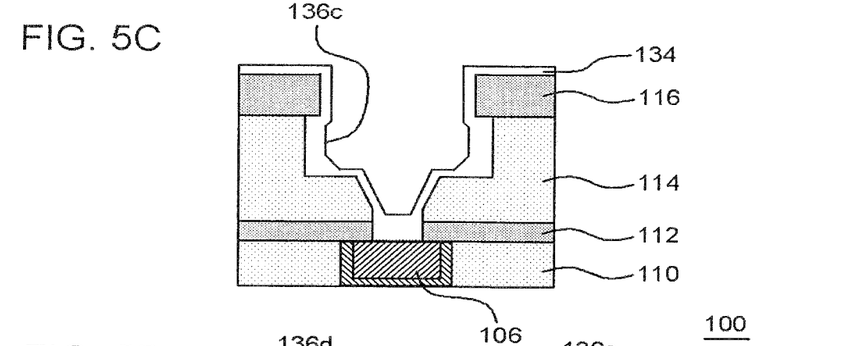

Then, the damage layer 130 is removed using, for example, hydrogen fluoride or the like (FIG. 5B). As a result, a recess portion 132 is formed in the low dielectric constant layer 114. Subsequently, a second protection insulating layer 134 is formed as described in FIG. 3C (FIG. 5C).

Figure 5D:
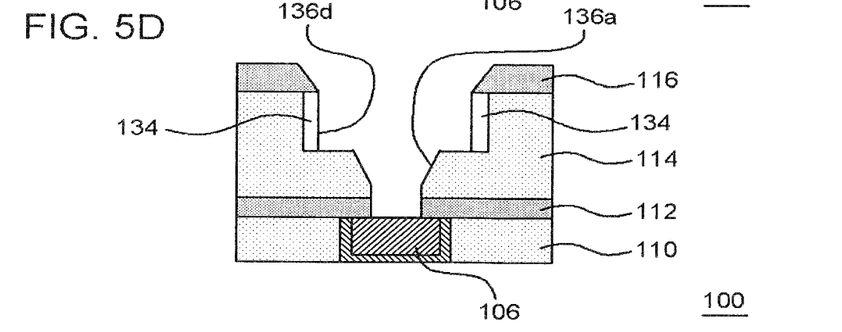

Subsequently, the second protection insulating layer 134 is shaped by etch back to form a trench 136d that a sidewall is protected by the second protection insulating layer 134 in the low dielectric constant layer 114. At this time, due to etch back, a portion of the second protection insulating layer 134 corresponding to a bottom of the via hole 136a is also removed, and a portion of the lower copper interconnect 106 corresponding to a bottom of the trench 136d is exposed (FIG. 5D). If the portion of the second protection insulating layer 134 formed at the bottom of the via hole 136a remains even after etch back, the portion of the second protection insulating layer 134 formed at the bottom of the via hole 136a may be removed by anisotropic dry etching using, for example, $CF_4$ gas or a sputtering etch technique using, for example, an Ar ion. Thereafter, as described in FIG. 4, a copper interconnect 138 is formed in the trench 136d and the via hole 136a.

In the method for manufacturing the semiconductor device according to the exemplary embodiment of the present invention, the damage layer 130 having a higher (than the low-k material) dielectric constant which is formed on the trench sidewall of the low dielectric constant layer 114 when the trench is formed is removed using hydrogen fluoride or the like, and the sidewall portion recessed by removing the damage layer 130 is recovered by the second protection insulating layer 134. Therefore, it is possible to easily control the size of the trench 136d while removing the damage layer 130 which causes capacitance between interconnects to be increased. As a result, since an increment in capacitance between interconnects of the semiconductor device 100 can be suppressed and a dimension of the groove size can be secured, a high speed performance can be maintained.

Second Exemplary Embodiment

FIGS. 6A to 9 are cross-sectional views illustrating a procedure of manufacturing a semi conductor device according to the exemplary embodiment of the present invention. The exemplary embodiment of the present invention is different from the first exemplary embodiment of the present invention in the fact that a dual damascene trench is formed in a low dielectric constant layer by "trench first method".

Figure 6A:
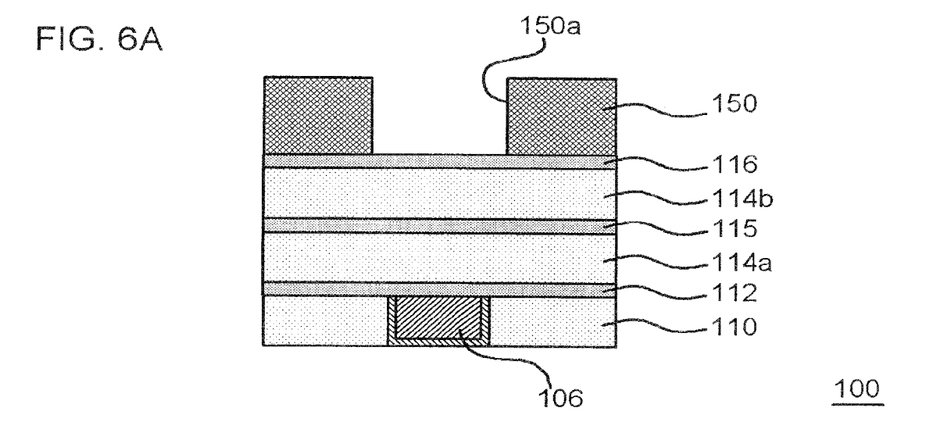
FIGS. 6A to 6C are cross-sectional view illustrating a procedure for manufacturing a semiconductor device according to the embodiment of the present invention.

A semiconductor device 100 has a structure that an insulating interlayer 110 is formed on a substrate (not shown) which is a semiconductor substrate such as a silicon substrate, and a lower copper interconnect 106 is formed in the insulating interlayer 110. In such a semiconductor device 100, an etching stopper 112, a first low dielectric constant layer 114a, an etching stopper 115, a second low dielectric constant layer 114b, and a first protection insulating layer 116 are formed on the insulating interlayer 110 and the lower copper interconnect 106 in the described order.

The first low dielectric constant layer 114a and the second low dielectric constant layer 114b may be made of the same material as the low dielectric constant layer 114 which is described in the first exemplary embodiment of the present invention. The first low dielectric constant layer 114a and the second low dielectric constant layer 114b may be made of either the same material or a different material. For example, the first low dielectric constant layer 114a may be made of a material that is lower in dielectric constant than a silicon oxide layer and has a k value of equal to or less than 3.5.

Subsequently, an antireflection layer (not shown) and a resist layer 150 having an opening pattern 150a for forming a trench are formed on the first protection insulating layer 116 (FIG. 6A). Here, the opening pattern 150a for forming a trench is formed at a location which overlaps the lower copper interconnect 106 when it is seen from a top. The resist layer 150 may be formed using a photolithography technique.

Figure 6B:
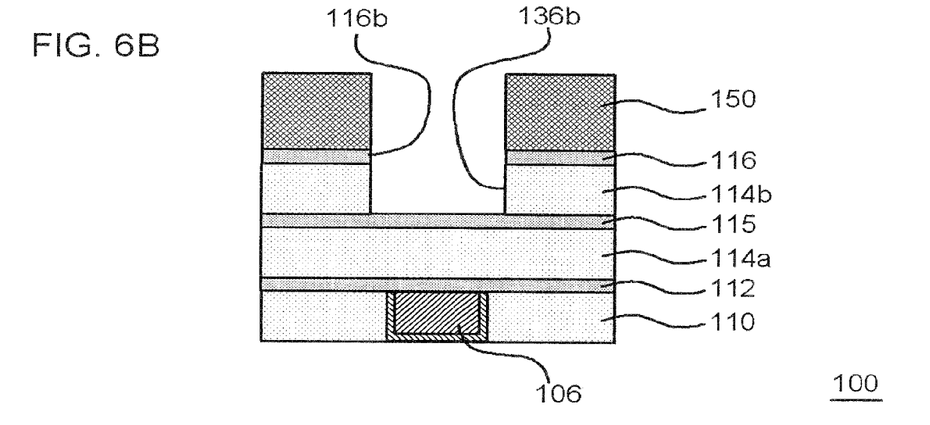

Subsequently, the antireflection layer and the first protection insulating layer 116 are etched using the resist layer 150 as a mask to form an opening pattern 116b in the first protection insulating layer 116. The second low dielectric constant layer 114b is etched using the first protection insulating layer 116 (and the above layers such as the resist layer 150 or the antireflection layer) as a mask to form a first concave portion 136b in the first protection insulating layer 116 and the second low dielectric constant layer 114b (FIG. 6B). As etching gas for etching the second low dielectric constant layer 114b, fluorocarbon gas such as $CF_4$ or $C_4F_8$ may be used, and gas such as $N_2$ gas, $O_2$ gas or Ar gas may be added. Thereafter, the resist layer 150 and the antireflection layer are removed by ashing. Ashing for removing, for example, the resist layer 150 and the like may be performed using gas such as $O_2$ gas, $CO_2$ gas, $N_2/H_2$ gas, $NH_3$ gas, or $He/H_2$ gas.

Figure 6C:
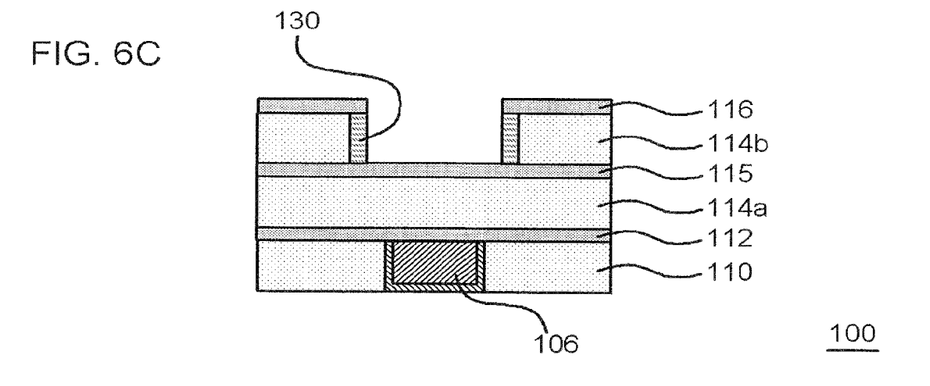

At this time, a damage layer 130 is formed on the sidewall of the second low dielectric constant layer 114b (FIG. 6C). If the damage layer 130 remains existed, since moisture is absorbed into the damage layer 130, an effective k value of the damage layer 130 is increased, and thus there is a problem in that capacitance between interconnects is increased.

Figure 7A:
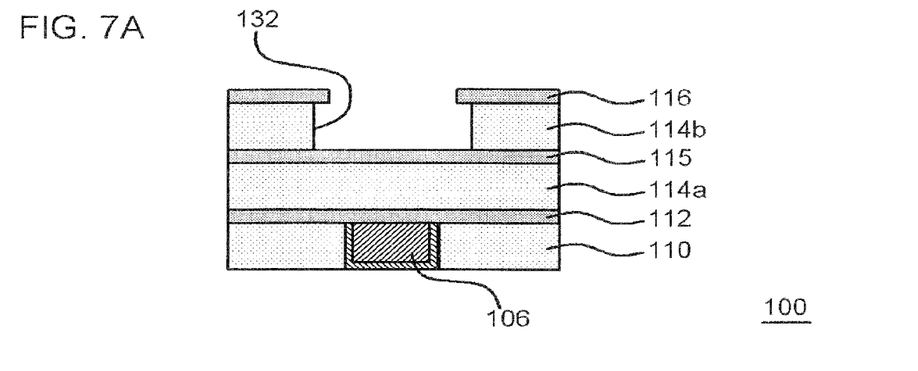
FIGS. 7A to 7C are cross-sectional views illustrating a procedure for manufacturing a semiconductor device according to the embodiment of the present invention.

For this reason, in the exemplary embodiment of the present invention, the damage layer 130 is removed using, for example, hydrogen fluoride or the like (FIG. 7A). As a result, a recess portion 132 is formed in the second low dielectric constant layer 114b. That is, the sidewall of the first concave portion 136b has a structure that the surface of the first protection insulating layer 116 protrudes from the surface of the second low dielectric constant layer 114b.

Figure 7B:
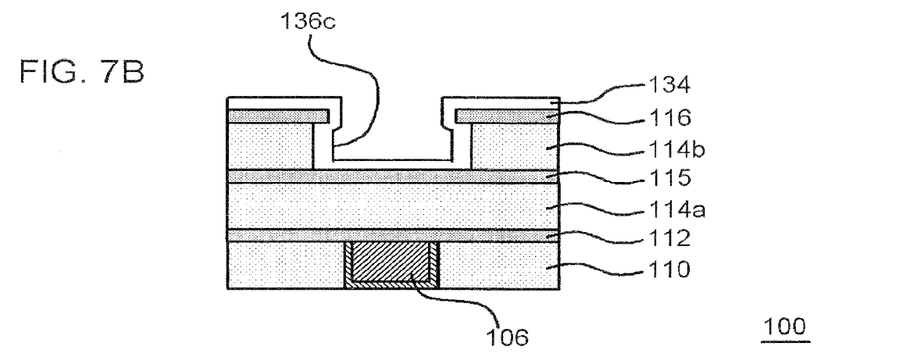

Subsequently, a second protection insulating layer 134 is formed over the whole surface of the substrate using a CVD technique such that the sidewall of the first concave portion 136b of the second low dielectric constant layer 114b is covered with the second protection insulating layer 134 to form a second concave portion 136c in the second low dielectric constant layer 114b (FIG. 7B). As a result, the recess portion 132 formed by removing the damage layer 130 is embedded with the second protection insulating layer 134.

In the exemplary embodiment of the present invention, a kind of a material of the second protection insulating layer 134 is different from that in the first exemplary embodiment of the present invention. In the exemplary embodiment of the present invention, the second protection insulating layer 134 may be made of a material which has resistance (plasma resistance) against gas such as $O_2$ gas, $CO_2$ gas, $N_2/H_2$ gas, $NH_3$ gas, and $He/H_2$ gas used to remove the resist layer which will be used to form the via hole later by asking. For example, the second protection insulating layer 134 may be formed of a $SiO_2$ layer, a SiOF layer, or a SiOH layer.

Figure 7C:
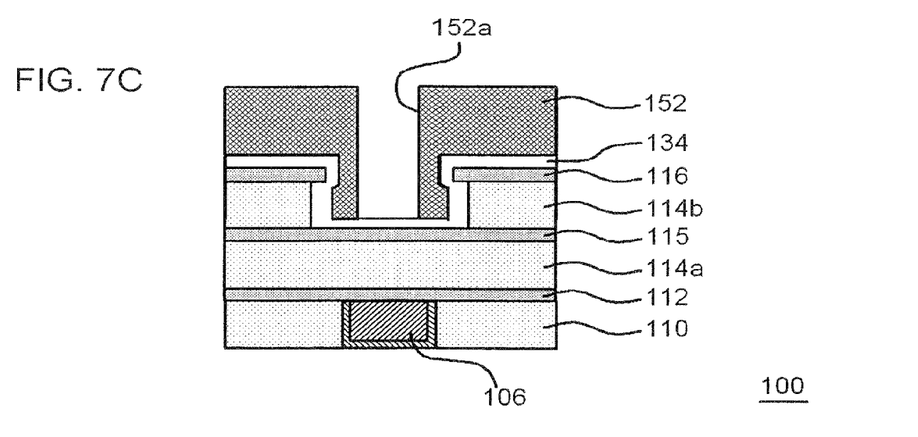

Thereafter, a resist layer 152 is formed over the whole surface of the substrate to embed the second concave portion 136c. Then, an opening 152a for forming a via hole is formed in the resist layer 152 by a photolithography technique (FIG. 7C). Here, the opening 152a for forming a via hole is formed at a location which overlaps the lower copper interconnect 106 when it is seen from a top.

Figure 8A:
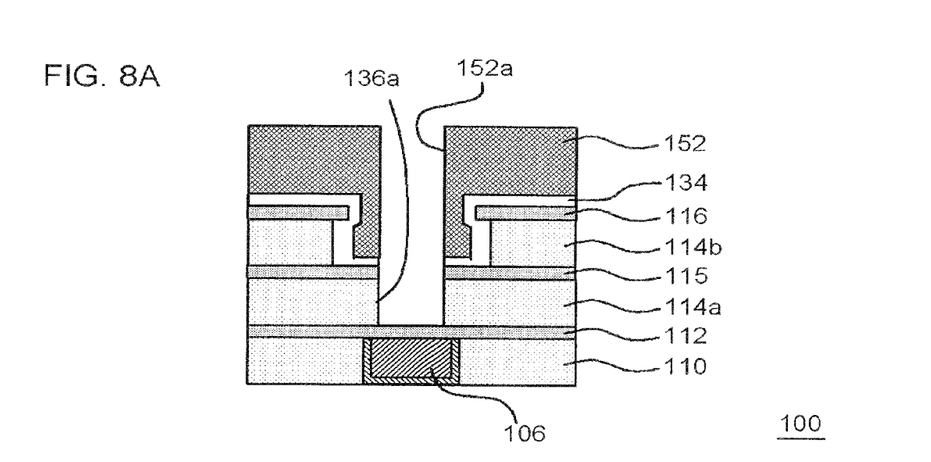
FIGS. 8A to 8C are cross-sectional views illustrating a procedure for manufacturing a semiconductor device according to the embodiment of the present invention.

Subsequently, the second protection insulating layer 134, the etching stopper 115 and the first low dielectric constant 114a are etched using the resist layer 152 as a mask to form a via hole 136a in the first low dielectric constant layer 114a (FIG. 8A). As etching gas for etching the first low dielectric constant layer 114a, fluorocarbon gas such as $CF_4$ or $C_4F_8$ may be used, and gas such as $N_2$ gas, $O_2$ gas or Ar gas may be added.

Figure 8B:
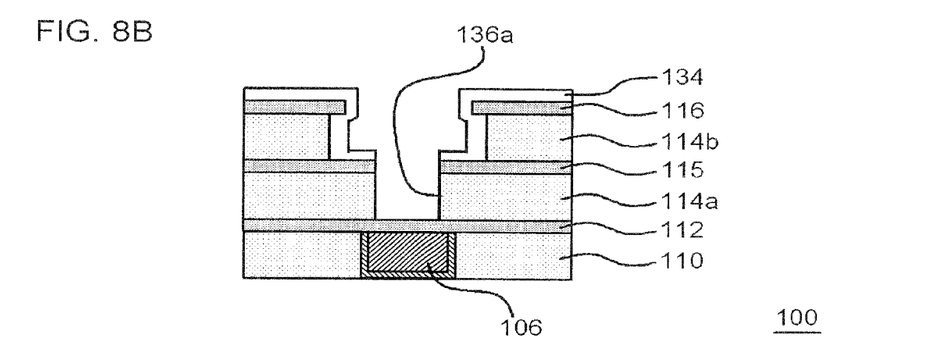

Subsequently, the resist layer 152 is removed by ashing (FIG. 8B). Ashing for removing the resist layer 152 may be performed using gas such as $O_2$ gas, $CO_2$ gas, $N_2/H_2$ gas, $NH_3$ gas, or $He/H_2$ gas. At this time, the sidewall of the second concave portion 136c is exposed. However, in the exemplary embodiment of the present invention, the second protection insulating layer 134 is made of a material which has resistance (plasma resistance) against gas used to remove the resist layer 152 by ashing. Since the second low dielectric constant layer 114b is protected by the second protection insulating layer 134, forming of the damage layer can be prevented.

Subsequently, the second protection insulating layer 134 is shaped by etch back to form a trench 136d that a sidewall is protected by the second protection insulating layer 134 in the second low dielectric constant layer 114b. At this time, since anisotropic etching is performed, a portion of the second protection insulating layer 134 formed at a top side of a stacking direction of the semiconductor device 100 is selectively removed. Also, since the first protection insulating layer 116 protrudes compared to the second low dielectric constant layer 114b, a portion of the second protection insulating layer 134 formed on the sidewall of the first protection insulating layer 116 is removed, but a portion of the second protection insulating layer 134 formed on the sidewall of the second low dielectric constant layer 114b is protected by the first protection insulating layer 116 and remains without being etched out. Accordingly, the second protection insulating layer 134 can have a structure which is selectively formed only on the sidewall of the second low dielectric constant layer 114b.

In the exemplary embodiment of the present invention, even in the trench 136d, an opening pattern of the first protection insulating layer 116 maintains the same shape as the opening pattern 150a for forming the trench of the resist layer 150. When the second protection insulating layer 134 is etched-back, the first protection insulating layer 116 functions as a mask, and a portion of the second protection insulating layer 134 below the first protection insulating layer 116 remains as it is. Therefore, the width of the trench 136d has the same width of the opening pattern of the first protection insulating layer 116, that is, it has the same width of the opening pattern 150a for forming the trench of the resist layer 150. Accordingly, a dimension of the groove size can be secured.

Figure 8C:
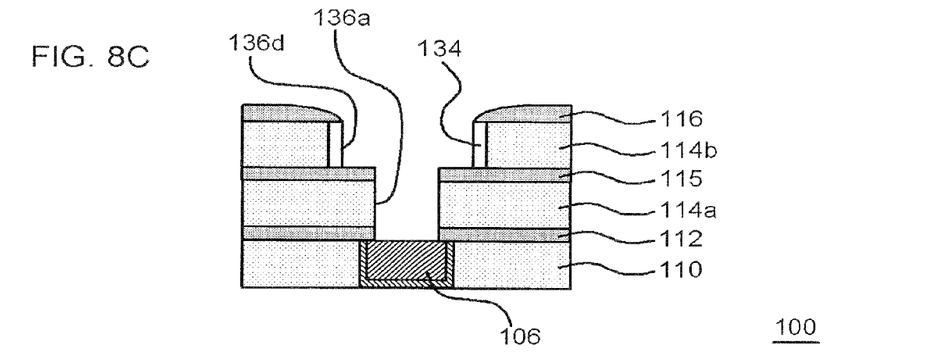

Then, a portion of the etching stopper 112 corresponding to a bottom of the via hole 136a (and the second protection insulating layer 134 if the second protection insulating layer 134 remains on the bottom of the via hole 136a) is removed by anisotropic dry etching using, for example, $CF_4$ gas or a sputtering technique using, for example, an Ar ion, thereby exposing a portion of the lower copper interconnect 106 at the bottom of the via hole 136a (FIG. 8C). Accordingly, a dual damascene trench which includes the via hole 136a and the trench 136d is formed.

Figure 9:
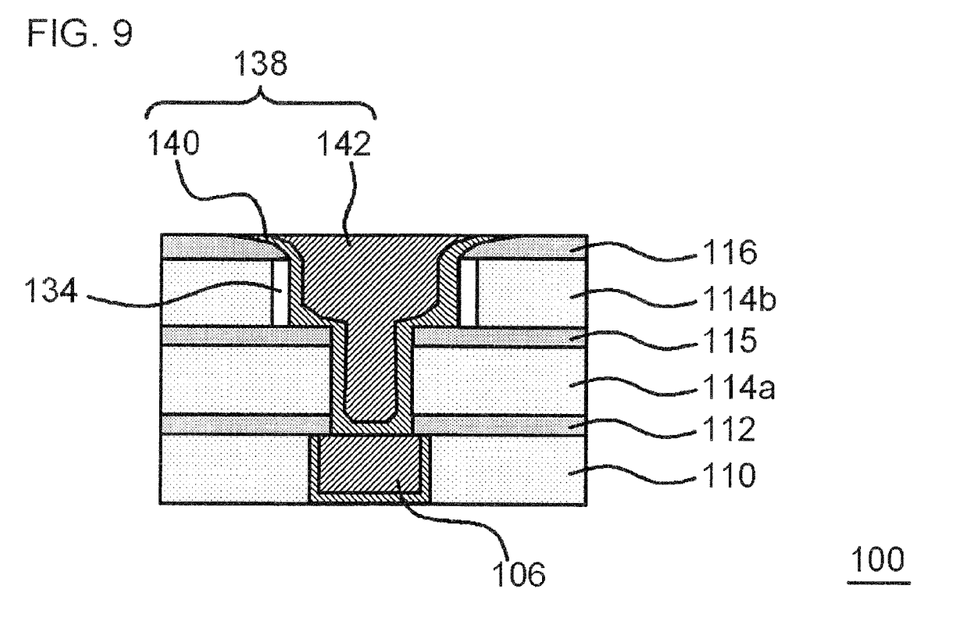
FIG. 9 is a cross-sectional view illustrating a procedure for manufacturing a semiconductor device according to the exemplary of the present invention.

Subsequently, a barrier metal layer 140 and a copper layer 142 are formed to embed the via hole 136a and the trench 136d, and portions of the barrier metal layer 140 and the copper layer 142 which are exposed outside the trench 136d are removed by a CMP technique, whereby a copper interconnect 138 is formed (FIG. 9). The copper interconnect 138 is electrically connected to the lower copper interconnect 106.

By the procedure, manufactured is the semiconductor device 100 that the sidewall of the trench 136d has a structure that the surface of the first protection insulating layer 116 protrudes from the surface of the second low dielectric constant layer 114b, the second protection insulating layer 134 formed by a CVD technique is formed on the sidewall of the second low dielectric constant layer 114b below the protruding portion of the first protection insulating layer 116, and the sidewall of the trench 136d is constituted by the second protection insulating layer 134 and the first protection insulating layer 116. Here, the sidewall of the trench 136d can have a structure that the surface of the second protection insulating layer 134 is matched with the surface of the first protection insulating layer 116.

In the method for manufacturing the semiconductor device according to the exemplary embodiment of the present invention, the damage layer 130 having a high dielectric constant which is formed on the trench sidewall of the second low dielectric constant layer 114b when the trench is formed is removed using hydrogen fluoride or the like, and the sidewall portion recessed by removing the damage layer 130 is recovered by the second protection insulating layer 134. Therefore, it is possible to easily control the size of the trench 136d to form the trench 136d while removing the damage layer 130 which causes capacitance between interconnects to be increased. As a result, since an increment in capacitance between interconnects of the semiconductor device 100 can be suppressed and a dimension of the groove size can be secured, a high speed performance can be maintained.

Hereinbefore, the exemplary embodiments of the present invention have been described with reference to the drawings, but these are for illustrative purposes and can employ various configurations other than described above.

In the exemplary embodiments of the present invention, the first exemplary embodiment has a structure that the etching stopper is not formed when the trench is formed in the insulating interlayer like the etching stopper 115 which is described in the second exemplary embodiment. However, the first exemplary embodiment can use a structure that the first low dielectric constant layer 114a, the etching stopper layer 115 and the second low dielectric constant layer 114b are stacked, which is described in the second exemplary embodiment, instead of the low dielectric constant layer 114. Also, the second exemplary embodiment can use the low dielectric constant layer 114 described in the first exemplary embodiment instead of a structure that the first low dielectric constant layer 114a, the etching stopper layer 115 and the second low dielectric constant layer 114b are stacked.

It is apparent that the present invention is not limited to the above embodiment, and may be modified and changed without departing from the scope and spirit of the invention.

What is claimed is:

1. A semiconductor device, comprising:
a substrate;
a low dielectric constant layer formed on said substrate and containing carbon;

a first protection insulating layer formed on said low dielectric constant layer;
a trench formed in said first protection insulating layer and said low dielectric constant layer; and
an interconnect embedded in said trench,
wherein the sidewall of said trench has a structure that the surface of said first protection insulating layer protrudes from the surface of said low dielectric constant layer, a second protection insulating layer formed by a chemical vapor deposition technique is embedded at the surface of said low dielectric constant layer in an area below said first protection insulating layer, and said second protection insulating layer and said first protection insulating layer are exposed at the sidewall of said trench.

2. The semiconductor device according to claim 1, wherein said low dielectric constant layer is a SiOC layer or a SiOCH layer.

3. The semiconductor device according to claim 1, wherein said second protection insulating layer is made of the same material as said low dielectric constant layer.

4. The semiconductor device according to claim 1, wherein said second protection insulating layer is a $SiO_2$ layer, a SiOF layer, a SiOH layer, a SiOC layer, or a SiOCH layer.

5. The semiconductor device according to claim 1, wherein said first protection insulating layer is a $SiO_2$ layer.

* * * * *